United States Patent

Kobayashi et al.

[11] Patent Number: 5,250,341
[45] Date of Patent: Oct. 5, 1993

[54] IC CARD

[75] Inventors: Makoto Kobayashi, Sanda; Syojiro Kodai; Katsunori Ochi, both of Itami, all of Japan

[73] Assignee: Mitsubishi Denki Kabushiki Kaisha, Tokyo, Japan

[21] Appl. No.: 648,511

[22] Filed: Jan. 30, 1991

[30] Foreign Application Priority Data

Mar. 26, 1990 [JP] Japan .................. 2-78295

[51] Int. Cl.$^5$ .............................. B32B 3/00
[52] U.S. Cl. .................. 428/137; 428/209; 428/915; 428/916; 428/198; 283/77; 283/83; 283/107; 283/109
[58] Field of Search .............. 428/137, 209, 915, 916, 428/198; 283/77, 83, 107, 109

[56] References Cited

U.S. PATENT DOCUMENTS

| | | | |
|---|---|---|---|
| 3,512,286 | 5/1970 | Siegel | 283/77 |
| 4,245,035 | 1/1981 | Poshkus | 283/77 |
| 4,417,413 | 11/1983 | Hoppe et al. | 40/630 |
| 4,450,024 | 5/1984 | Haghiri-Tehrane et al. | 156/108 |
| 4,617,216 | 10/1986 | Haghiri-Tehrani | 283/107 |
| 4,879,153 | 11/1989 | Ohashi et al. | 428/76 |
| 4,889,749 | 12/1989 | Ohashi et al. | 428/13 |
| 5,026,452 | 6/1991 | Kodai | 156/293 |

FOREIGN PATENT DOCUMENTS

| | | | |
|---|---|---|---|
| 3151408 | 6/1983 | Fed. Rep. of Germany . | |
| 0188298 | 10/1989 | Japan | 283/83 |
| 0263089 | 10/1989 | Japan | 283/83 |
| 0263090 | 7/1990 | Japan | 283/83 |

Primary Examiner—Patrick J. Ryan
Assistant Examiner—Cathy Lee
Attorney, Agent, or Firm—Leydig, Voit & Mayer

[57] ABSTRACT

In an IC card and a manufacturing method therefor, an adhesive is applied between core layers in the vicinity of an opening in which an IC module is placed. The core sheet layers held between adhesive layers can easily be deformed when heat and pressure are applied. Therefore, a gap formed between the card substrate and the IC module is filled. Furthermore, the gap from the IC module is narrower at the corners of the IC module than conventionally shaped openings. As a result, gaps at the corners of the IC module after integral molding are prevented. Therefore, the gap between the IC module and the card substrate can be reliably filled during molding.

16 Claims, 8 Drawing Sheets

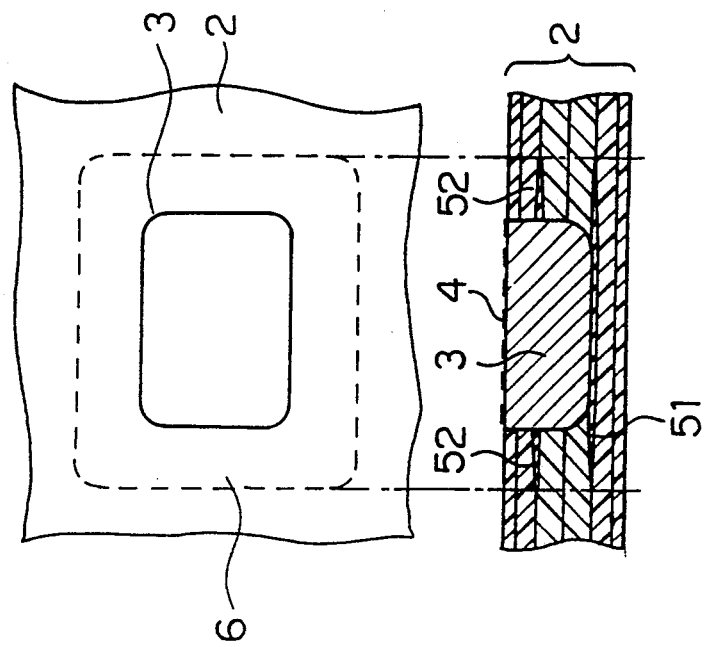
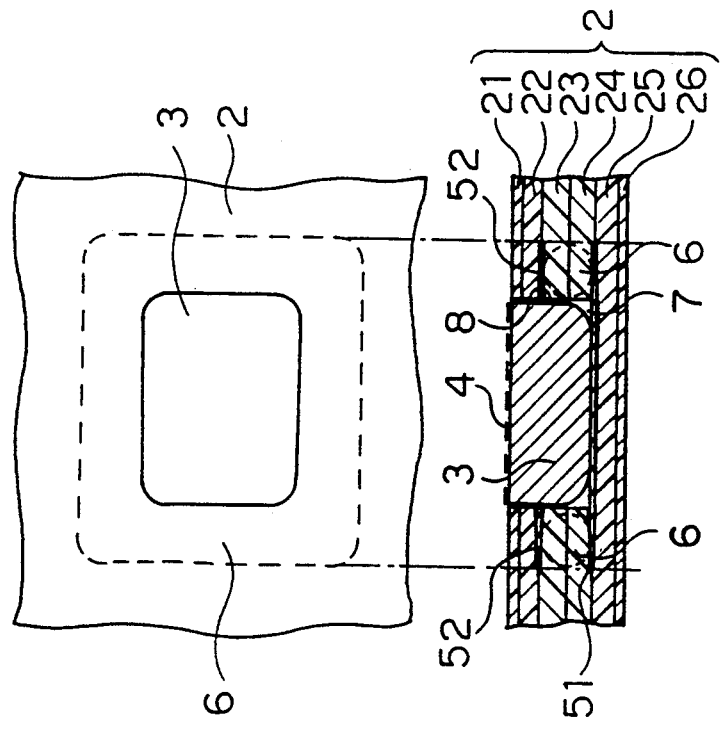

IC CARD

BACKGROUND OF THE INVENTION

Field of the Invention

The present invention relates to the structure of an IC card and a manufacturing method therefore, the IC card being manufactured by integrally molding a multilayer structure and an IC module.

Hitherto, when an IC card of a type which is constituted by an IC module in an opening portion in a card substrate and a boundary portion adhered by an adhesive is manufactured, the adhesive is used only in the opening portion as described below.

FIGS. 9A to 9C illustrate an IC card of the type described above. FIG. 9A is a plan view of the IC card. FIG. 9B is a side cross sectional view of the same and FIG. 9C is an enlarged cross sectional view which illustrates a card substrate 2 of an IC card 1 and IC module 3. Referring to the drawings, the card substrate 2 is a multilayer sheet structure constituted by stacking overlays 21 and 26 as the outer layers which hold core sheets 22, 23, 24 and 25 therebetween. Each of the above-described sheets which form the multilayer structure has a through hole formed in a portion thereof forming an opening portion 8. Furthermore, an adhesive layer 5 is formed on the core sheet 25 which serves as the bottom portion of the opening portion 8, the adhesive layer 5 being disposed on the portion of the core sheet 25 which is in contact with the module 3.

Then, a process for manufacturing the IC card will be described. First, all of the sheets 21 to 26 are stacked up so that the opening portion 8 into which the IC module 3 is placed is formed. After the IC module 3 has been fitted within the above-described opening portion 8, the overall body is heated and pressure is applied while the body is held by a mirror plate. That is, the card substrate of an existing credit card is, as regulated in JIS X6301, structured in such a manner that a multiplicity of hard vinyl chloride sheets are layered, the sheets in the form of a multilayer structure being then heated and pressed so as to be integrally molded, i.e., welded to one another.

FIGS. 10A to 10C illustrate another IC card. An IC module 3a is arranged to have, in vertical cross section a stepped portion. As shown in FIG. 10C which is an enlarged cross sectional view, an opening portion 8a into which the IC module 3a is fitted also has a two-step cross sectional shape and the adhesive layer is divided into two layers (5a and 5b). Other structures and the process for stacking the sheets and integrally molding the stacked structure are the same as those of the structure shown in FIGS. 9A to 9C.

The conventional IC cards of the type described above have been arranged in such a manner that the IC module is fitted within the opening portion formed through the sheets which constitute the card substrate. Therefore, the contour of the IC module and that of the opening portion must have precise dimensional accuracy. In particular, there arises a problem in that the IC module 3a having, as illustrated in FIGS. 10A to 10C, shape cannot easily be fitted into the opening portion 8a formed in the multilayer sheet while maintaining precise accuracy.

SUMMARY OF THE INVENTION

An object of the present invention is to overcome the above-described problems. Therefore, an object of the present invention is to provide an IC card and a manufacturing method therefore capable of, at the time of an integral molding with heat and pressure, perfectly plugging a gap generated due to variations in the dimension accuracy of an opening portion formed in a card substrate and that of the contour of an IC module which is coupled with the opening portion.

An IC card according to the present invention comprises: a card substrate having a multilayer sheet structure formed by stacking a plurality of sheets, the multilayer sheet structure having an opening in which an IC module is mounted; and an adhesive for adhering the IC module to the card substrate, the above-described card substrate, the multilayer sheet structure, the IC module and the adhesive being integrally molded with heat and pressure, wherein the adhesive is applied to a portion around the IC module between internal layers of a multilayer sheet constituting the card substrate in such a manner that two or more adhesive layers are at least partially overlapped so as to be integrally molded with heat and pressure.

According to the present invention, the adhesive placed between the internal layers of the multilayer sheet structure is melted at the time of the integral molding with heat and pressure. Therefore, the sheet material held between the adhesive layers can easily be deformed due to the action of the adhesive serving as a lubricant. As a result, a gap formed around the opening portion into which the IC module is mounted can be filled.

BRIEF DESCRIPTION OF THE DRAWINGS

FIGS. 2A and 2B are partially enlarged views which respectively illustrate a state before of the IC card shown in FIGS. 1A to 1C and a state after the IC card has been integrally molded;

DESCRIPTION OF THE PREFERRED EMBODIMENTS

An embodiment of the present invention will now be described with reference to the drawings.

Figure 1A:
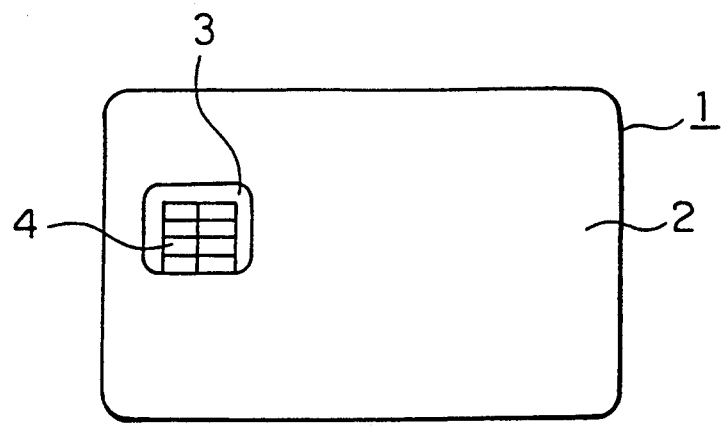
FIGS. 1A to 1C are respectively a plan view, a side cross sectional view and an enlarged cross sectional view which illustrate an embodiment of an IC card according to the present invention.
Figure 1B:
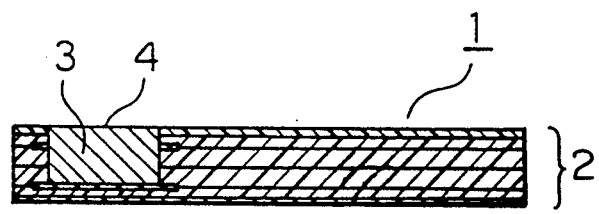
Figure 1C:
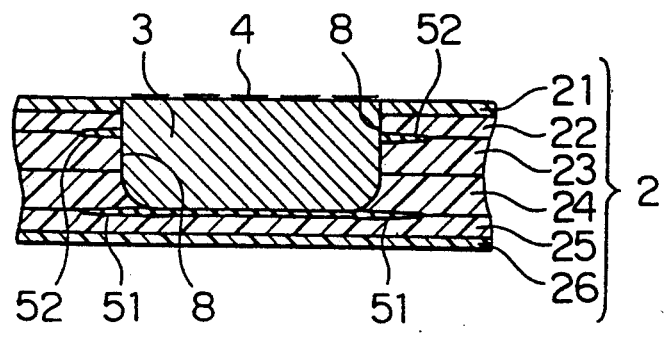

FIGS. 1A to 1C illustrate an IC card according to the present invention. FIG. 1A is a plan view which illustrates the IC card, FIG. 1B is a side cross sectional view which illustrates the same and FIG. 1C is an enlarged cross sectional view which illustrates a state where a card substrate 2 and an IC module 3 are combined. FIG. 2A is an enlarged view which illustrates a state before the card substrate 2 of the IC card 1 and the IC module 3 are integrally molded. FIG. 2B is an enlarged view which illustrates a state after they have been integrally molded.

Referring to the drawings, the card substrate 2 is, similarly to the conventional structure, in the form of a multilayer sheet structure arranged in such a manner that overlays 21 and 26 serving as the outer layers and core sheets 22, 23, 24 and 25 serving as the inner layers and held between the overlays 21 and 26 are stacked. Furthermore, an opening portion 8 into which the IC module 3 is fitted is formed in the above-described multilayer structure.

According to this embodiment, an adhesive is applied in such a manner that two layers of adhesive are respectively disposed between the core sheets 22 and 23 and between the core sheets 24 and 25, the adhesive being placed only around the opening portion 8. That is, as shown in FIG. 2A, an adhesive 52 is placed between the core sheets 22 and 23. Furthermore, an adhesive 51 is placed between the core sheets 24 and 25, including a portion which comes in contact with the bottom surface of the IC module 3. Furthermore, the adhesives 51 and 52 are applied so as to form layers around the opening portion 8 formed in the card substrate into which the IC module 3 is fitted. In this state, the IC module 3 is fitted into the opening portion 8 in such a manner that its external connection terminal 4 appears outside the surface of the IC card.

At this time, a gap 7 is formed between the opening portion 8 in the card substrate 2 and the IC module 3. In particular, since the opening portion 8 positioned in the card substrate is formed by overlapping the through holes formed in the core sheets, the shape of the opening portion 8 usually becomes a rectangular shape. Therefore, the gap 7 becomes too large as shown in FIG. 2A when the IC module, which has rounded corners along its bottom side which opposes the external connection terminal 4, is mounted.

After the sheets 21 to 26, the adhesives 51 and 52 and the IC module 3 have been coupled to one another, heat and pressure are applied to the coupled structure while holding the two sides of the structure (omitted from the illustration) so that a stacked structure is molded.

Figure 9A:
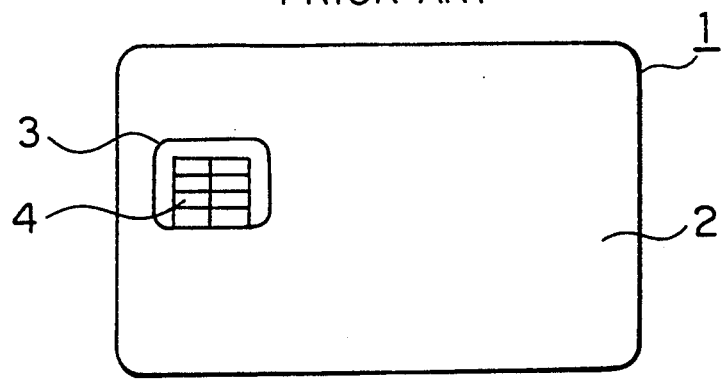
FIGS. 9A to 9C are respectively a plan view, a side cross sectional view and an enlarged cross sectional view which illustrate a conventional IC card.
Figure 9B:
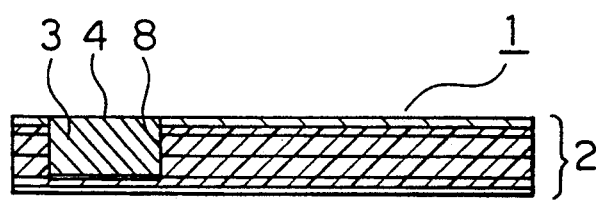
Figure 9C:
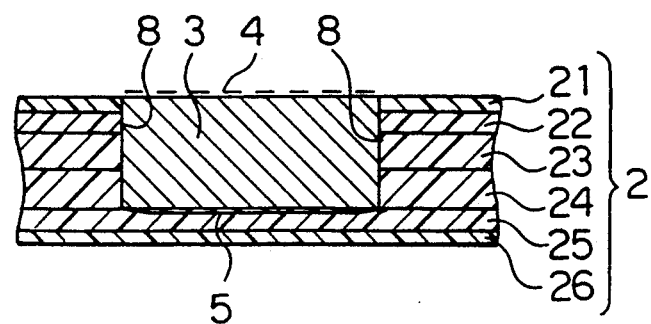
Figure 10A:
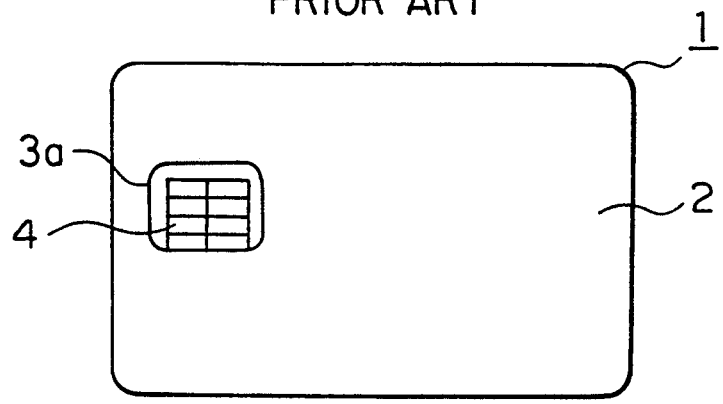
FIGS. 10A to 10C are respectively a plan view, a side cross sectional view and an enlarged cross sectional view which illustrate another conventional IC card.
Figure 10B:
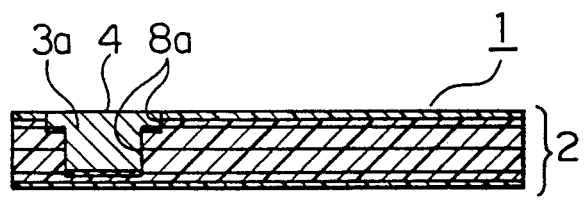
Figure 10C:
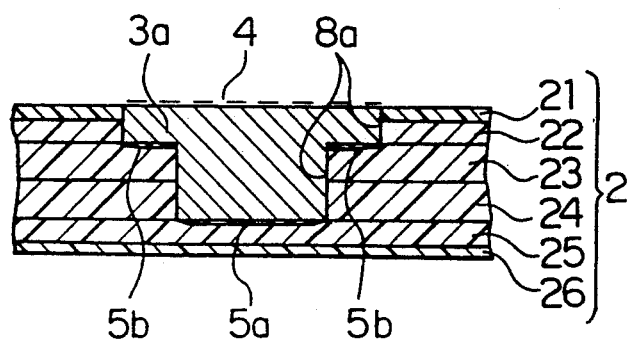

If the adhesive 5 (see FIGS. 9C and 10C) is softened or melted at the time of molding the stacked structure, the gap cannot be filled satisfactorily since there is no passage through which the adhesive 5 may flow. In particular, a relatively large gap 7 as shown in FIG. 2A cannot be filled. As a result, the gap causes undesired wrinkles on the card surface, which critically damages appearance of the IC card.

However, according to this embodiment, the adhesives 51 and 52 are applied so as to form the two overlapped layers. Therefore, a portion 86 around the opening portion formed in the core sheets 23 and 24, which are held by the adhesives 51 and 52, of the card substrate is held with slide surfaces at the time of molding the stacked structure by heat and pressure. As a result, the portion 6 can move sideways very easily, causing the gap 7 to be plugged filled, as shown in FIG. 2B, by the core sheets 23 and 24 which can slide.

Furthermore, as shown in the drawings in detail, since the adhesives 51 and 52 are simply held between the core sheets, the area that each of the portions to which the adhesives 51 and 52 have been respectively applied is enlarged by the amount of the adhesives 51 and 52 before the integral molding is performed. However, since the gap is filled by the core sheet after integral molding with heat and pressure, the surface can be flattened. The portion of the IC card to which no adhesive is applied does not, of course, slide sideways during molding of the stacked structure.

The sheets (made of, for example, vinyl chloride resin) of the card substrate are respectively melted at temperatures near their melting points at the time of molding the stacked structure (by heat and pressure). Therefore, for example, a heat sensitive adhesive having a melting point which is lower than that of the material (vinyl chloride) of the sheet is employed as the adhesives 51 and 52. As an alternative, a pressure sensitive adhesive or a B-stage heat sensitive type adhesive may be employed.

An essential portion of this embodiment lies in that two adhesive layers serving as lubricating layers at the time of molding the stacked structure to form the IC card are stacked so as to easily move and deform the core sheets disposed between the adhesive layers. As a result, the gap around the IC module can be eliminated.

Figure 3A:
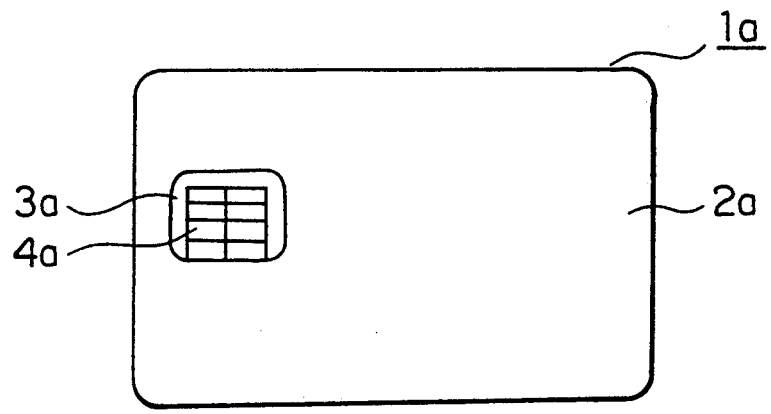
FIGS. 3A to 3C are respectively a plan view, a side cross sectional view and an enlarged cross sectional view which illustrate another embodiment of an IC card according to the present invention.
Figure 3B:
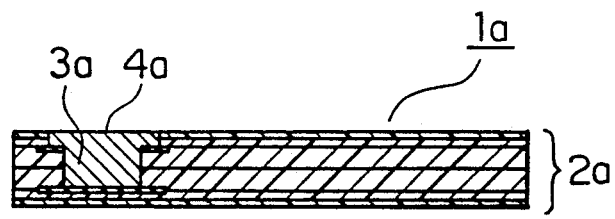
Figure 3C:
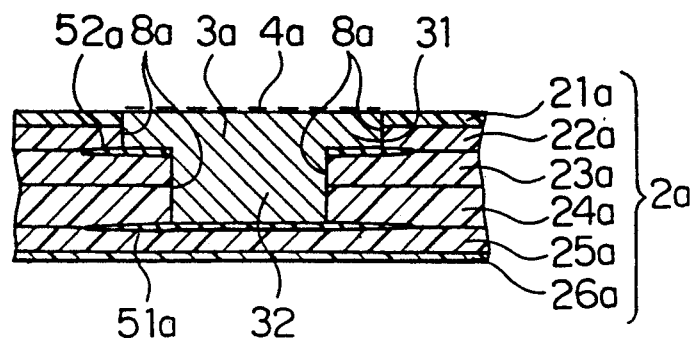
Figure 4A:
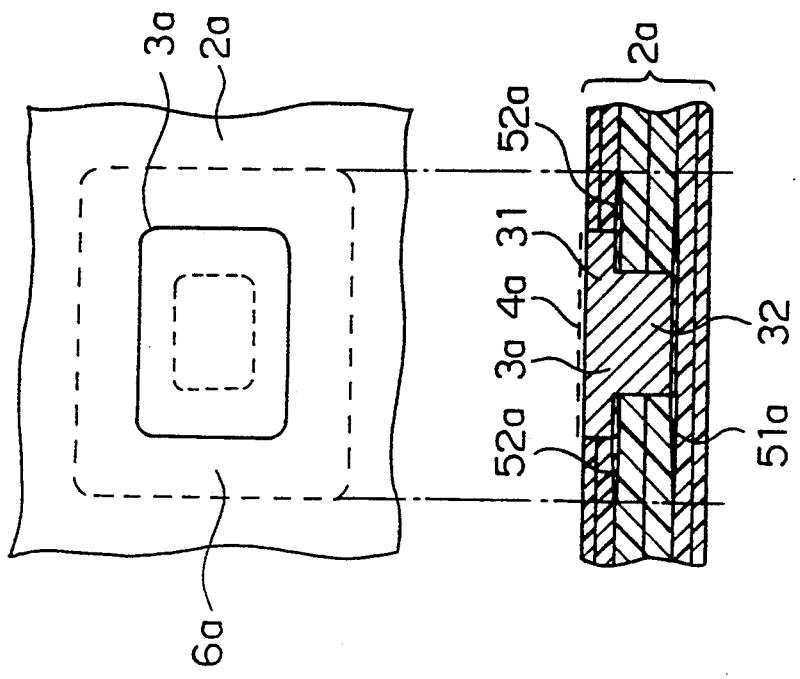
FIGS. 4A and 4B are partially enlarged views which respectively illustrate a state before of the IC card shown in FIGS. 3A to 3C and a state after the IC card has been integrally molded.
Figure 4B:
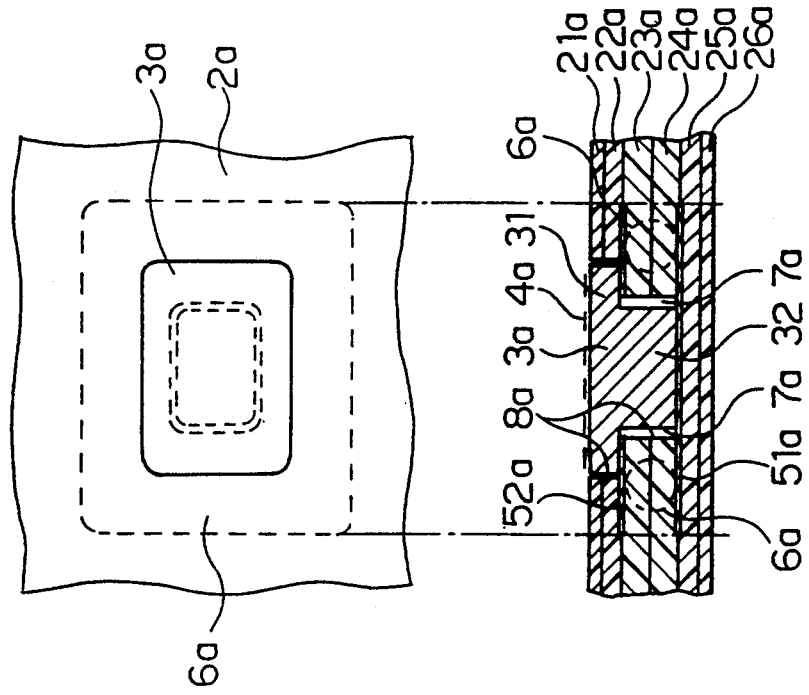

FIGS. 3A, 3C, 4A and 4B illustrate another embodiment of the IC card according to the present invention. FIG. 3A is a plan view which illustrates the IC card, FIG. 3B is a side cross sectional view which illustrates the same and FIG. 3C is an enlarged cross sectional view which illustrates a state where a card substrate 2a of an IC card 1a and an IC module 3a are coupled to each other. FIG. 4A is an enlarged view which illustrates a state before the card substrate 2a of the IC card 1a and the IC module 3a are coupled to each other. FIG. 4B is an enlarged view which illustrates a state after they have been coupled to each other.

According to this embodiment, the vertical cross sectional shape of the IC module 3a is not a rectangle but is a two-stepped shape arranged in such a manner that the side on which the external connection terminal 4a is present has a larger area on the surface of the card than within the card. When the IC card is warped, stress is concentrated in a portion of the card substrate with which the lower corner of the IC module comes in contact. Therefore, the above-described portion can easily be broken. Accordingly, the shape of the IC module 3a according to this embodiment is arranged as illustrated so that the number of the corners of the IC module 3a is increased so as to disperse the stress applied when the IC card is warped. In the following description, the portion of the IC module 3a having a large horizontal area is called a "terminal mount portion 31" and the portion having a small area is called a "body portion 32".

In this case, an opening portion 8a formed in a card substrate 2a is formed by stacking sheets respectively having through holes the size of which are different from one another. Therefore, an error may occur in the stacked sheets. Furthermore, the IC module 3a, when it is manufactured, may vary in its shape between the terminal mount portion 31 and the central axis (the vertical axis) of the body portion 32. The external connection terminal 4a must be positioned at a desired position on the card substrate 2a so as to establish a satisfactory connection with the card reader of the IC card. Therefore, the distance between the terminal mount portion 31 of the IC module 3a and an overlay 21a and that between the IC module 3a and a core sheet 22a must be greatly reduced. Therefore, both the above-described dimensional deflections are absorbed by the body portion 32 of the IC module 3a. That is, the through holes respectively formed in the core sheets 23a and 24a have a large size, whereby a large gap 7a is formed.

When the stacked structure is integrally molded with heat and pressure, the portion 6a of the intermediate layer surrounding the IC module 3a held between the adhesive layers 51a and 52a slides inwards due to the lubricating action of the adhesive layer 52a between the core sheets 22a and 23a and the adhesive layer 51a between the core sheets 24a and 25a. As a result, the above-described gap 7a can effectively be filled.

Figure 5A:
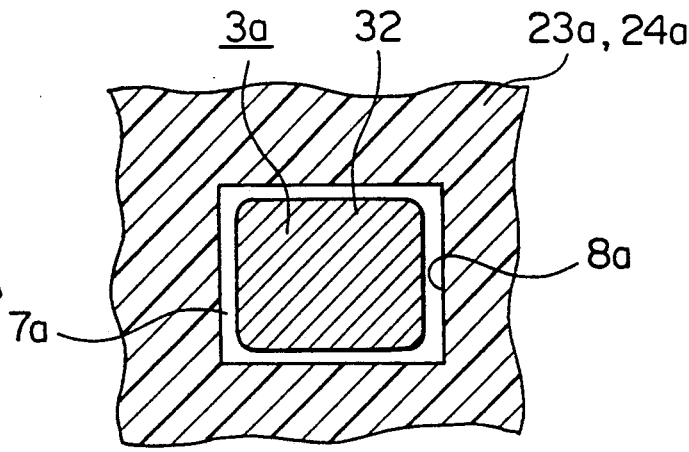
FIGS. 5A, 5B and 6 are plan cross sectional views which illustrate a state where a gap between an IC module and an opening portion are is filled.
Figure 5B:
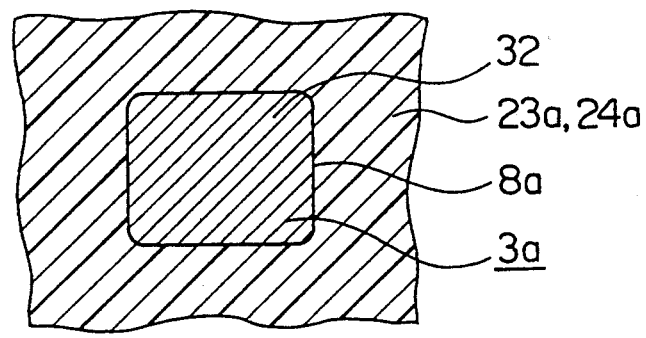

FIG. 5A is a plan cross sectional view which illustrates a portion of the core sheets 23a and 24a held between the adhesive layers 51a and 52a according to the second embodiment shown in FIGS. 3A to 4B, i.e. the portion surrounding the IC module 3a. As described above, the through hole formed by the core sheets 23a and 24a held between the adhesive layers 51a and 52a is large enough to absorb the dimensional tolerance of the opening portion 8a and the IC module 3a. The gap 7a exists around the IC module 3a before the integral molding. In the case shown in FIG. 5A, the through hole 8a formed by the core sheets 23a and 24a is substantially similar to the body 32 of the IC module 3a. Furthermore, the width of the gap 7a is substantially constant around the IC module 3a. After the integral molding has been completed with heat and pressure, the gap 7a is filled due to the deformation of each of the core sheets 23a and 24a. Identically, the gap 7a may be completely filled by the core sheet material as shown in FIG. 5B.

Figure 6:
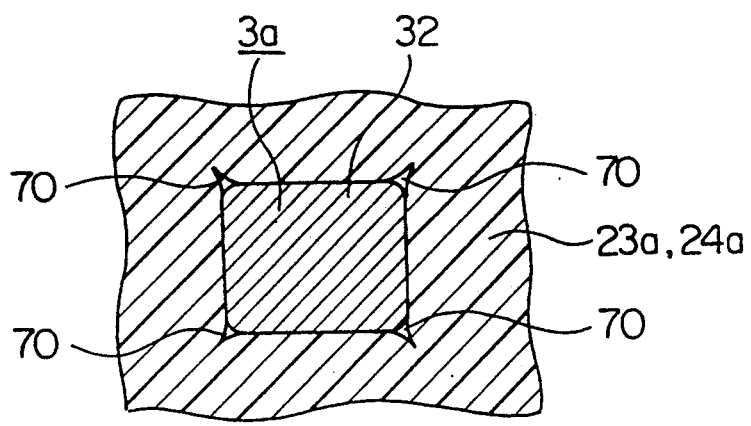

However, portions 70 which are not filled with the core sheet material will, as shown in FIG. 6, be formed at positions which correspond to the four corners of the IC module 3a. The above-described undesirable portions 70 will be formed in a case where deformation of the core sheets 23a and 24a around the IC module 3a takes place parallel to the gap 7a and the deformation at the central portion of each of the four sides, which is the straight portion, takes place faster than the deformation of the four corners. If the portions 70 which are not filled with the core sheet material are formed, undesirable recessed portions or pits may be formed along the surface of the IC card.

Figure 7:
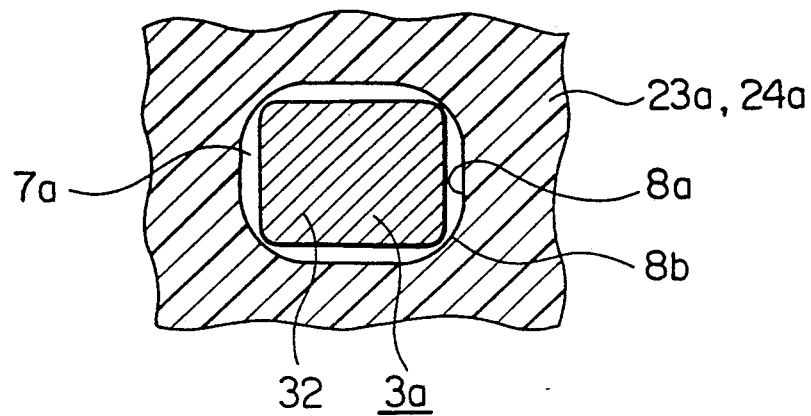
FIG. 7 is a plan cross sectional view which illustrates the shape of a through hole formed in a core sheet of the IC card according to the present invention.

Accordingly, another embodiment of the present invention is, as shown in FIG. 7, arranged in such a manner that the through hole 8a formed in the core sheets 23a and 24a is in the form of a shape having four corner portions 8b which respectively have a radius of curvature which is larger than that of the corner of the body portion 32 of the IC module 3a. As a result, if the speed of deformation of the straight portion of the through hole 8a is too fast, the gap 70 (see FIG. 6) can be completely eliminated from each of the corner portions 8b. The elimination of the undesirable gap is a critical factor in improving the appearance of the IC card. If a slight portion which is not filled with the core sheet material exists, undesirable pits are formed in the surface of the IC card, causing the quality of the appearance of the IC card to be deteriorated. Furthermore, even if the dimension of the body portion 32 of the IC module 3a and that of the through hole 8a vary, the above-described two elements are in point-contact. Therefore, the IC module 3a can smoothly be fitted within the opening portion.

Figure 8:
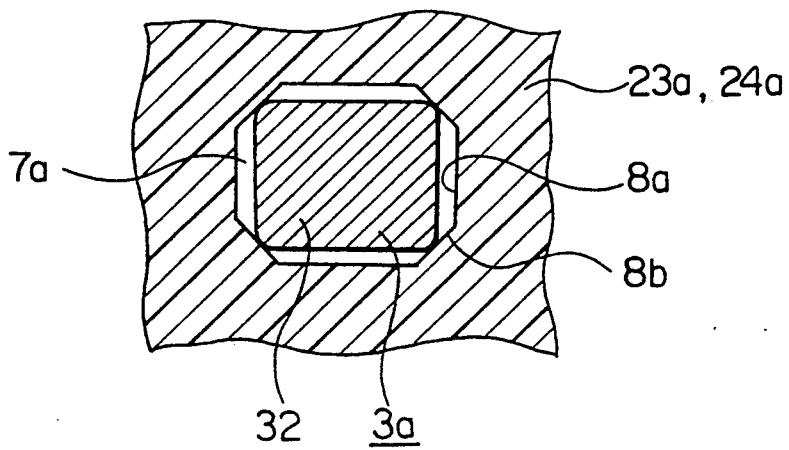
FIG. 8 is a horizontal cross sectional view which illustrates the shape of a through hole formed in a core sheet of the IC card according to another embodiment of the present invention.

The through hole 8a formed in the core sheets 23a and 24a may be in the form of a shape formed by cutting straight the corner portion 8b diagonally as shown in FIG. 8. The shape of the through hole formed in the core sheets 23a and 24a is not limited to the shapes respectively shown in FIGS. 7 and 8. Any shape can be employed if it is arranged in such a manner that the width of the gap 7a is reduced in the corner portion or the corner portion is able to contact the corner portion of the IC module in a point-contact.

According to each of the above-described embodiments, two layers composed of the core sheets 23 and 24 (23a and 24a) are placed between the adhesive layers 51a and 52a. However, a similar effect can be obtained from a structure in which one core sheet is placed between the adhesive layers or a structure in which three or more core sheets are stacked.

Another structure may be employed which is arranged in such a manner that three or more adhesive layers are stacked by additionally providing an adhesive layer between the core sheets 23 and 24 (23a and 24a).

As described above, the IC card according to the present invention is arranged in such a manner that the adhesive is applied to form two or more layers which overlap one another around the opening portion into which the IC module is embedded, the adhesive being placed on the inner surface of the card substrate having the multilayer sheet structure. Therefore, the core sheet layer held between the adhesive layers can easily be deformed at the time of integral molding with heat and pressure. As a result, the gap between the card substrate and the IC module can be perfectly filled. Furthermore, the above-described opening portion formed in the core sheets held between the adhesive layers is arranged in such a manner that the gap with the IC module is reduced in the corners of the opening in comparison to the gap along the straight sides of the module. As an alternative to this, the opening portion is arranged to come in contact with the corner portion of the IC module at a point-contact. Therefore, the gap can be eliminated from the corner portion of the IC module after the integral molding has been performed. As a result, the gap around the IC module can be perfectly and assuredly filled.

What is claimed is:

1. An IC card comprising:
   an IC module having opposing first and second surfaces, a relatively large cross sectional area in a first portion and a relatively small cross sectional area in a second portion and including an external connection terminal on the first surface;
   a card substrate including a stack of a plurality of core sheets, a portion of said plurality of core sheets including through holes forming an opening receiving said IC module with the first surface exposed; and
   a plurality of adhesive layers disposed between respective core sheets adjacent said IC module, wherein at least two of said adhesive layers are disposed directly opposite each other adjacent said IC module within said stack of core sheets.

2. An IC card according to claim 1 wherein said IC module is substantially cubic, said first portion has a rectangular shape, said second portion includes rounded corners, and said at least two adhesive layers are placed between respective pairs of core sheets to respectively hold core sheets having through holes corresponding to said second portion of said IC module.

3. An IC card according to claim 2 wherein one of said adhesive layers is positioned in the opening in contact with the second surface of said IC module.

4. An IC card according to claim 1 wherein said IC module is in the form of a two stepped dice-like shape composed of an upper portion consisting of a terminal mount portion having an external connection terminal on the upper surface thereof and a large horizontal cross sectional area and a lower portion consisting of a body portion having a horizontal cross sectional area which is smaller than that of said upper portion.

5. An IC card according to claim 4 wherein said two or more adhesive layers are placed between said core sheets so as to respectively hold one or more core sheets positioned to correspond to said body portion of said IC module.

6. An IC card according to claim 1 wherein the through hole formed in a core sheet corresponding to said first portion of said IC module has a size and shape which does not form a gap with said IC module and the through hole formed in a core sheet corresponding to said second portion of said IC module has a size and shape to form a gap with said IC module.

7. An IC card according to claim 6 wherein one of said adhesive layers is positioned in the opening in contact with the second surface of said IC module.

8. An IC card according to claim 2 wherein each of the through holes formed in said core sheets has a shape forming a gap with said IC module which at least narrows at corner portions of said IC module.

9. An IC card according to claim 8 wherein each of said through holes formed in said core sheets positioned to correspond to said second portion of said IC module has, in the portion corresponding to said corners of said IC module, a shape rounded with a radius of curvature larger than the radius of curvature of said corners of said IC module.

10. An IC card according to claim 7 wherein each of the through holes formed in said core sheets has an octagonal shape including sides tangent to each of the corners of said IC module.

11. An IC card according to claim 1 wherein said card substrate includes an outer protection sheet layer formed by integral molding.

12. An IC card according to claim 1 wherein said adhesive layer is made of a heat sensitive type adhesive having a melting point lower than the melting point of said core sheets.

13. An IC card according to claim 1 wherein said adhesive layer is a pressure sensitive type adhesive.

14. An IC card according to claim 1 wherein said adhesive layer is a B-stage heat hardening type adhesive.

15. An IC card comprising:
   an IC module having opposed first and second surfaces and including an external connection terminal on the first surface;
   a card substrate including a stack of a plurality of core sheets, a portion of said plurality of core sheets including through holes forming an opening receiving said IC module with the first surface exposed; and
   a plurality of adhesive layers disposed between respective core sheets adjacent said IC module, wherein at least two of said adhesive layers are disposed directly opposite each other adjacent said IC module within said stack of core sheets.

16. An IC card according to claim 15 wherein one of said adhesive layers is positioned in the opening in contact with the second surface of said IC module.

* * * * *